(12) United States Patent  (10) Patent No.: US 8,610,263 B2
Hino et al.  (45) Date of Patent: Dec. 17, 2013

(54) SEMICONDUCTOR DEVICE MODULE

(75) Inventors: Yasunari Hino, Tokyo (JP); Kiyoshi Arai, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 160 days.

(21) Appl. No.: 12/908,327

(22) Filed: Oct. 20, 2010

(65) Prior Publication Data

US 2011/0180809 A1 Jul. 28, 2011

(30) Foreign Application Priority Data

Jan. 27, 2010 (JP) ................................. 2010-014912

(51) Int. Cl.
*H01L 29/24* (2006.01)
(52) U.S. Cl.
USPC ..... 257/713; 257/706; 257/719; 257/E23.101
(58) Field of Classification Search
USPC ........... 257/713, E23.101, E23.103, E23.105, 257/675, 678, 706, 719; 438/122
See application file for complete search history.

(56) References Cited

U.S. PATENT DOCUMENTS

| 7,812,443 | B2 | 10/2010 | Tokuyama et al. | |
|---|---|---|---|---|
| 2005/0135067 | A1 | 6/2005 | Park et al. | |
| 2007/0215897 | A1* | 9/2007 | Shen et al. | 257/103 |
| 2008/0251909 | A1* | 10/2008 | Tokuyama et al. | 257/706 |

FOREIGN PATENT DOCUMENTS

| JP | 53-140369 | | 11/1978 |
|---|---|---|---|
| JP | 54-5569 | | 1/1979 |
| JP | 62-130547 | | 6/1987 |
| JP | 03-101156 | | 4/1991 |
| JP | 03-117846 | | 12/1991 |
| JP | 5-145011 | | 6/1993 |
| JP | 5-315517 | A | 11/1993 |
| JP | 7-94669 | A | 4/1995 |
| JP | 2001-156225 | | 6/2001 |
| JP | 2005-184007 | A | 7/2005 |
| JP | 2006-19465 | A | 1/2006 |
| JP | 2007-110870 | A | 4/2007 |
| JP | 2008-042089 | | 2/2008 |
| JP | 2008-259267 | | 10/2008 |
| JP | 2009-193928 | A | 8/2009 |
| JP | 2009-231672 | | 10/2009 |
| JP | 2009231672 | A | * 10/2009 |

OTHER PUBLICATIONS

Combined Chinese Office Action and Search Report issued Oct. 10, 2012, in Patent Application No. 201010571357.7 (with English-language translation of the Search Report).

(Continued)

*Primary Examiner* — Daniel Whalen
*Assistant Examiner* — Suberr Chi
(74) *Attorney, Agent, or Firm* — Oblon, Spivak, McClelland, Maier & Neustadt, L.L.P.

(57) ABSTRACT

A P-side package unit and a N-side package unit are arranged on a main surface of a metal heatsink such that a main surface extends in a direction perpendicular to the main surface of the heatsink. Each of the P-side package unit and the N-side package unit is fixed by an end edge portion of a heatsink being clipped by a rail-shaped unit mounting part provided on the main surface of the heatsink.

12 Claims, 11 Drawing Sheets

(56) References Cited

OTHER PUBLICATIONS

Office Action issued Nov. 13, 2012 in Japanese Patent Application No. 2010-014912 (with partial English-language translation).
Korean Office Action with Japanese translation issued Jan. 11, 2012 in patent application No. 10-2011-0006628 with partial English translation.
German Office Action issued May 17, 2013 in Patent Application No. 10 2011 003 205.3 with English Translation.
Chinese Office Action issued May 22, 2013, in China Patent Application no. 201010571357.7 (with English translation).
Office Action issued on Oct. 8, 2013 in Japanese Application No. 2012-282374, along with its partial English translation.

* cited by examiner

F I G . 1
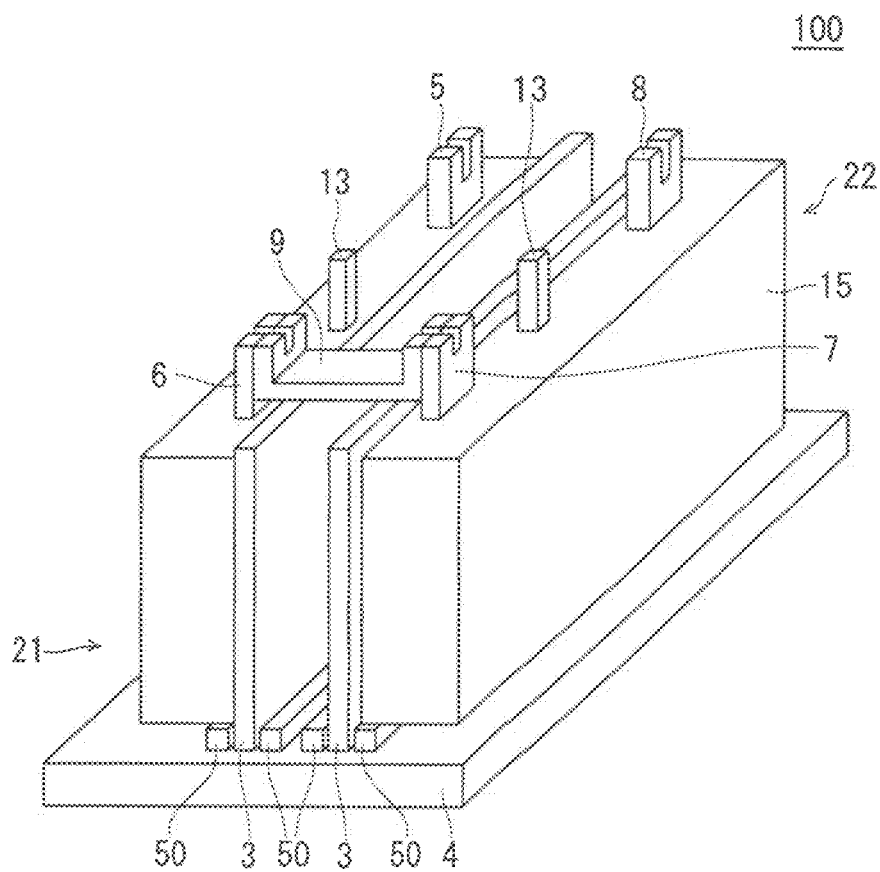

F I G. 2
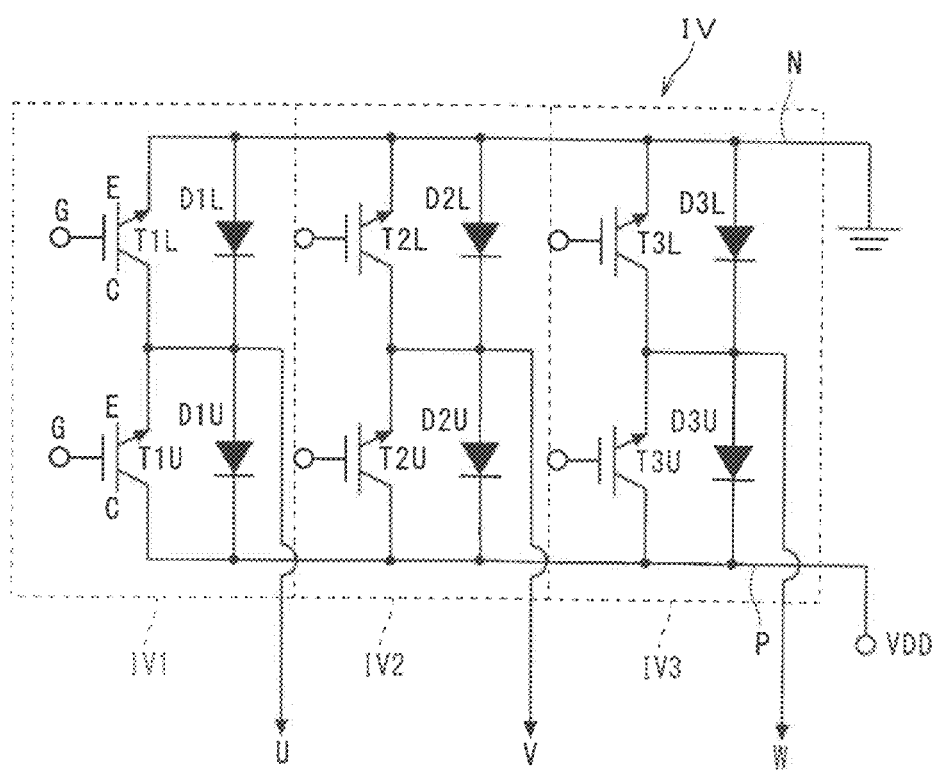

F I G . 7
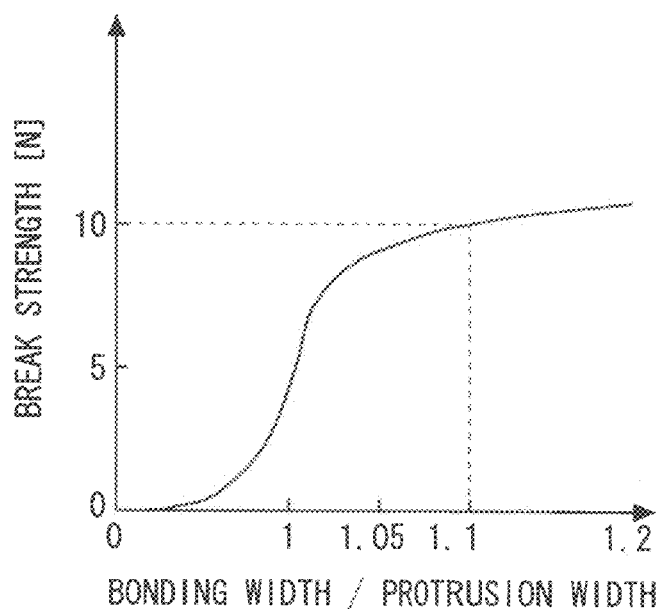
F I G . 8
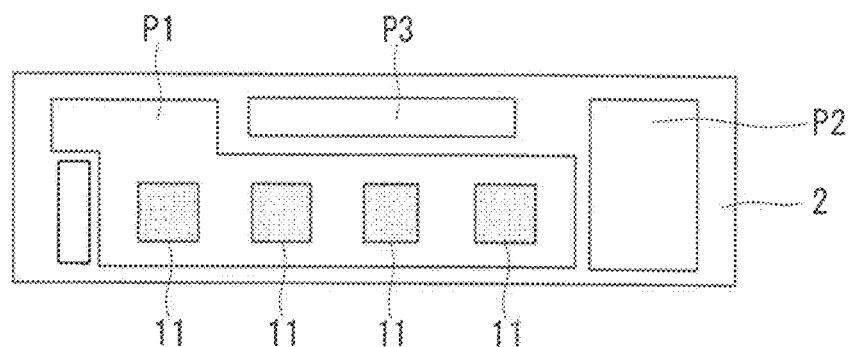

F I G. 1 2
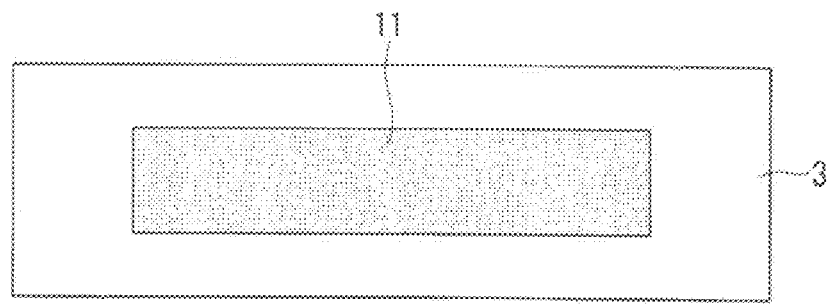
F I G. 1 3
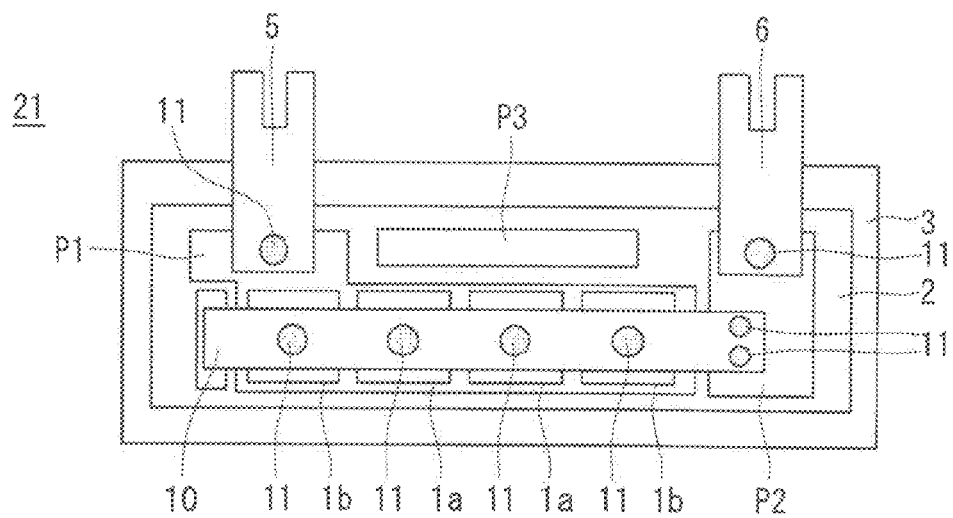

SEMICONDUCTOR DEVICE MODULE

BACKGROUND OF THE INVENTION

1. Field of the Invention

The present invention relates to a semiconductor device module, and particularly to a semiconductor device module operable at a high temperature.

2. Description of the Background Art

In a semiconductor device, many electronic components are mounted, and the electronic components and a wire member are connected to each other, thus forming an electrical circuit. Conventionally, arranging the electronic components and connecting the wire member are performed by screwing or brazing such as soldering. For example, Japanese Patent Application Laid-Open No. 5-145011 (1993) discloses a configuration in which an inner lead of a semiconductor chip is connected to an externally leading conductor plate by a cream solder.

In recent semiconductor devices, an increasing number of and various kinds of parts are required along with an advance in functionality, but on the other hand, downsizing and weight reduction thereof are also demanded from the viewpoint of being used in consumer-use electrical products and in-car electronic devices.

In recent years, a semiconductor element (silicon carbide semiconductor element) using a silicon carbide (SiC) substrate as a semiconductor substrate instead of a silicon substrate has been developed.

It is considered that a silicon carbide semiconductor element is operable at a higher temperature than a conventional silicon semiconductor element is. In the silicon semiconductor element, it is difficult to obtain a so-called high-Tj semiconductor device which ensures a junction temperature (Tj) of 175° C. or higher.

In this respect, it is considered that the silicon carbide semiconductor element can deal with a high Tj. For this purpose, it is necessary to ensure durability also at a wiring-connected part within a semiconductor device module.

In the silicon semiconductor element, a layout is largely restricted because of the necessity to increase heat dissipation, which puts a limitation on downsizing of the semiconductor device module. For example, Japanese Patent Application Laid-Open No. 2001-156225 discloses a configuration in which a semiconductor chip is flatly disposed and a heat dissipation member is pressed to both main surfaces of the semiconductor chip to thereby increase heat dissipation.

On the other hand, in the silicon carbide semiconductor element capable of dealing with a high Tj, this restriction is small and larger downsizing of the semiconductor device module is allowed. However, previously, sufficient downsizing could not be achieved.

SUMMARY OF THE INVENTION

An object of the present invention is to provide a semiconductor device module operable at a high temperature and capable of downsizing and weight reduction.

According to an aspect of the present invention, a semiconductor device module includes a circuit board, a first heatsink, at least one circuit unit, and a second heatsink. The circuit board has a semiconductor element mounted thereon. The first heatsink has the circuit board mounted thereon. The at least one circuit unit has a main electrode terminal which is electrically connected to a main electrode of the semiconductor element. The second heatsink has the at least one circuit unit mounted thereon. The first heatsink is mounted on the second heatsink such that its main surface extends perpendicularly to a main surface of the second heatsink. The main electrode terminal extends in a direction parallel to the main surface of the first heatsink, and has one end thereof connected to the circuit board and the other end thereof protruding from an upper side of the first heatsink.

The first heatsink is mounted on the second heatsink such that its main surface extends perpendicularly to the main surface of the second heatsink. The main electrode terminal extends in the direction parallel to the main surface of the first heatsink, and has one end thereof connected to the circuit board and the other end thereof protruding from the upper side of the first heatsink. Therefore, a downsized and weight-reduced semiconductor device module can be obtained.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a perspective view showing a configuration of a semiconductor device module according to a preferred embodiment 1 of the present invention;

FIG. 2 shows a circuit configuration of the semiconductor device module;

FIG. 7 is a diagram for explaining a bonding strength of a welded part;

FIGS. 8 to 16 are diagrams each showing a manufacturing step of the semiconductor device module according to the preferred embodiment 1 of the present invention;

DESCRIPTION OF THE PREFERRED EMBODIMENTS

Preferred Embodiment 1

<Configuration of Device>

Figure 3:
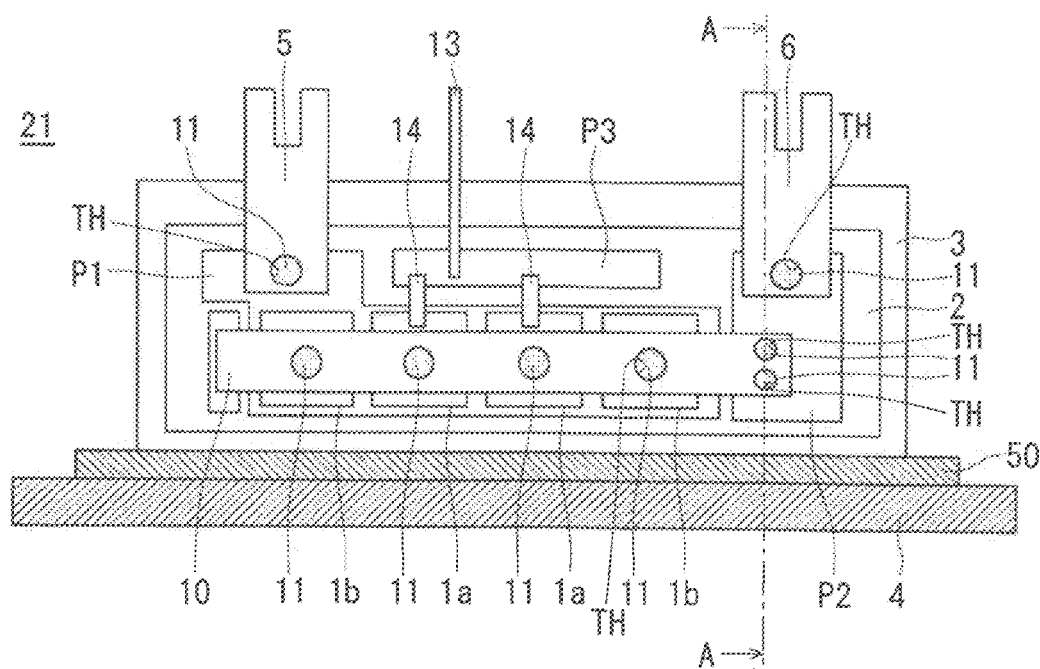
FIG. 3 shows a configuration of a P-side package unit.

A preferred embodiment 1 of the present invention will be described with reference to FIGS. 1 to 16. FIG. 1 is a perspective view showing a configuration of a semiconductor device module 100.

As shown in FIG. 1, the semiconductor device module 100 has a P-side package unit 21 and an N-side package unit 22, in each of which a semiconductor element (not shown) is sealed with a resin such as silicon or epoxy. The P-side package unit 21 and the N-side package unit 22 are disposed on a main surface of a metal heatsink 4 such that main surfaces of metal heatsinks 3 extend perpendicularly thereto.

Each of the P-side package unit 21 and the N-side package unit 22 is fixed by an end edge portion of the heatsink 3 being clipped by a rail-shaped unit mounting part 50 which is provided on the main surface of the heatsink 4.

Specifically, the unit mounting part 50 has two elongated members extending along the long side of the heatsink 4 in parallel with each other with an interval therebetween, and the two elongated members are paired to form a rail structure. The end edge portion at a long side of the heatsink 3 is clipped in a slit of the rail.

At the long side of the P-side package unit 21 opposite to the side thereof clipped by the unit mounting part 50, a first main electrode terminal 5, a second main electrode terminal 6, and a signal terminal 13 protrude from a side surface of a resin package 15 having a rectangular parallelepiped shape. At the long side of the N-side package unit 22 opposite to the side thereof clipped by the unit mounting part 50, a first main electrode terminal 7, a second main electrode terminal 8, and a signal terminal 13 protrude from a side surface of a resin package 15.

Each of the P-side package unit 21 and the N-side package unit 22 forms one circuit unit in the semiconductor device module, but the P-side package unit 21 and the N-side package unit 22 are different from each other in the arrangement of the main electrode terminals. The P-side package unit 21 and the N-side package unit 22 are arranged such that the heatsinks 3 are opposed to each other, so that the respective first main electrode terminal and second main electrode terminal are opposed to each other.

The second main electrode terminal 6 and the first main electrode terminal 7 are electrically and mechanically connected to each other by a conductive connecting member 9. Each of the first main electrode terminal 5, the second main electrode terminal 8, and the signal terminals 13 is also connected to an external equipment such as a power source, an electrical equipment, and a control circuit, though not shown.

Next, a circuit configuration of the semiconductor device module 100 will be described with reference to FIG. 2. FIG. 2 is a circuit diagram of a three-phase inverter IV, and the three-phase inverter IV includes three inverters IV1 to IV3. The inverter IV1 includes IGBTs (insulated gate bipolar transistor: hereinafter, sometimes simply referred to as a transistor) T1L and T1U, and free-wheeling diodes D1L and D1U. The IGBTs T1L and T1U are connected in series with each other between a power supply line P to which a power source voltage VDD is supplied and a power supply line N connected to the ground potential. The free-wheeling diodes D1L and D1U are connected in inverse parallel with the transistors T1L and T1U, respectively. A connection node of the transistors T1L and T1U is U-phase output.

The inverter IV2 has the same configuration, including transistors T2L and T2U connected in series with each other between the power supply lines P and N, and free-wheeling diodes D2L and D2U connected in inverse parallel with the transistors T2L and T2U, respectively. A connection node of the transistors T2L and T2U is V-phase output.

The inverter IV3 includes transistors T3L and T3U connected in series with each other between the power supply lines P and N, and free-wheeling diodes D3L and D3U connected in inverse parallel with the transistors T3L and T3U, respectively. A connection node of the transistors T3L and T3U is W-phase output.

In FIG. 2, an emitter, a collector, and a gate of each of the transistors T1L and T1U of the inverter IV1 are indicated as E, C, and G, respectively.

The semiconductor device module 100 forms the inverter IV1, for example. The P-side package unit 21 is configured to have the transistor T1U and the free-wheeling diode D1U. The first main electrode terminal 5, the second main electrode terminal 6, and the signal terminal 13 are connected to the collector C, the emitter E, and the gate G of the transistor T1U, respectively. In the same manner, the N-side package unit 22 is configured to have the transistor T1L and the free-wheeling diode D1L. The first main electrode terminal 7, the second main electrode terminal 8, and the signal terminal 13 are connected to the collector C, the emitter E, and the gate G of the transistor T1L respectively. In this case, the second main electrode terminal 6 and the first main electrode terminal 7 connected to each other by the connecting member 9 are U-phase output.

In this manner, when the semiconductor device module 100 is configured as one inverter circuit, the three-phase inverter IV shown in FIG. 2 is formed by combining three semiconductor device modules 100.

Next, an internal configuration of the semiconductor device module 100 will be described with reference to FIGS. 3 to 5. FIG. 3 shows the P-side package unit 21 as seen from the resin package 15 side, with omission of the illustration of the resin package 15.

A circuit board 2 is mounted on the main surface of the heatsink 3. Two semiconductor elements 1a and two semiconductor elements 1b, four in total, are arranged in series on a conductor pattern P1 having an elongated shape and formed on a main surface of the circuit board 2. Each of the semiconductor elements 1a and 1b has a side length of 2 to 5 mm and a thickness of 0.06 to 0.25 mm.

The semiconductor elements 1a and 1b are silicon carbide semiconductor elements formed on a silicon carbide substrate. The semiconductor element 1a is a switching element such as an IGBT or a MOSFET (metal oxide semiconductor field effect transistor). The semiconductor element 1b is an SBD (schottky barrier diode) or the like.

If the silicon carbide semiconductor element is used, a semiconductor device module having a small size and an excellent heat resistance can be obtained as compared with when a silicon semiconductor element is used.

In the configuration shown in FIG. 3, an IGBT 1a is used as the semiconductor element 1a, and an SBD 1b is used as the semiconductor element 1b. The transistor T1U and the free-wheeling diode D1U which have been described with reference to FIG. 2 correspond to the IGBT 1a and the SBD 1b, respectively. However, in the exemplary circuit configuration shown in FIG. 3, two transistors T1U and two free-wheeling diodes D1U are connected in parallel with one another.

The above-described example is merely illustrative. The kind of the semiconductor element is not limited to the above-described one. The number of the semiconductor element may be one or more. The kind, the number, and the combination thereof may be selected in accordance with a product specification such as a required current, voltage, and the like. Parts sharing enables cost reduction.

The IGBT 1a and SBD 1b are connected to the conductor pattern P1 by the electrodes (the collector of the IGBT, and the cathode of the diode) at the back surface side thereof being connected to the conductor pattern P1 with a brazing material such as a high-temperature solder or a bonding material 11 (not shown) such as a conductive adhesive material.

The electrodes at the upper surface side of the IGBT 1a and the SBD 1b are the emitter of the IGBT and the anode of the diode. A wire member 10 having a thickness of 0.3 to 1.5 mm and formed of a metal with a good conductivity such as copper or its alloy material is arranged so as to extend over upper surfaces of the IGBTs 1a and SBDs 1b, and is bonded to the upper surfaces of the elements by a brazing material such as a high-temperature solder or the bonding material 11 such as a conductive adhesive.

Here, if the high-temperature solder is used as the bonding material 11, a solder material having Sn (tin) as a main component and having a heat resistance of 175° C. or higher is used. If the conductive adhesive is used as the bonding material 11, for example, used is a silver-nanoparticle paste, which is obtained by covering silver particles (silver nanoparticles) each having a diameter of 2 to 30 nm with organic molecular films, is prepared. The silver-nanoparticle paste is applied to the upper surfaces of the IGBT 1a and the SBD 1b, and the wire member 10 is put thereon so as to extend across them, and then sintering is performed. Thereby, a bonded part having a thermal conductivity of 20 to 90 W/mK and a heat resistance of 175° C. or higher can be formed.

The first main electrode terminal 5 is also bonded to an end edge portion of the conductor pattern P1. A separate conductor pattern P2 is arranged at a side of the conductor pattern P1 with respect to an extending direction thereof, opposite to the side where the first main electrode terminal 5 is bonded. The wire member 10 is bonded to the conductor pattern P2, and also the second main electrode terminal 6 is bonded thereto.

Each of the first main electrode terminal 5 and the second main electrode terminal 6 is formed of a metal having a good conductivity, such as copper or an alloy material thereof, and has a thickness of 0.3 to 1.5 mm and a long-side length of 5 to 20 mm.

Through holes TH are formed in the first main electrode terminal 5, the second main electrode terminal 6, and the wire member 10, and filled with the bonding material 11. In this configuration, surfaces of the first main electrode terminal 5, the second main electrode terminal 6, and the wire member 10 are bonded to surfaces opposed thereto by the bonding material 11, and inner wall surfaces of the through holes TH are also bonded by the bonding material 11. Thus, bonded parts with a high reliability can be obtained. In the example of FIG. 3, the number of through holes TH provided in each of the first main electrode terminal 5 and the second main electrode terminal 6 is one. However, this is not limitative.

A separate conductor pattern P3 is provided in parallel with the extending direction of the conductor pattern P1. The signal terminal 13 is bonded to the conductor pattern P3, and the conductor pattern P3 and the gates of the IGBTs 1a are bonded to each other by leads 14. The lead 14 is formed as a wire of a metal such as aluminum, and may be bonded by press-contact using wire bonding or ultrasonic bonding, or may be bonded by using a conductor plate and the bonding material 11.

When the IGBT 1a, the SBD 1b, and the first main electrode terminal 5 are bonded to the conductor pattern P1 by using the bonding material 11 or a conductive adhesive, when the second main electrode terminal 6 and the wire member 10 are bonded to the conductor pattern P2 by using the bonding material 11 or a conductive adhesive, and when the wire member 10 is bonded to the electrodes at the upper surfaces of the IGBT 1a and the SBD 1b by using the bonding material 11 or a conductive adhesive, all the bonding can be simultaneously performed through a common thermal treatment step, which can improve productivity.

The second main electrode terminal 6 is not directly connected to main electrodes of the IGBT 1a and the SBD 1b, but is connected to the conductor pattern P2 and then electrically connected to the main electrodes of the IGBT 1a and the SBD 1b via the wire member 10. This configuration can prevent unnecessary moment to be applied to the semiconductor element when an end of the main electrode terminal is welded or sealed by a resin, which will be described later.

The circuit board 2 is an insulating substrate having insulation properties and formed of any one of AlN (aluminium nitride), $Al_2O_3$ (alumina), and $Si_2N_3$. The circuit board 2 has a thickness of 0.6 to 3 mm and a long-side length of 10 to 150 mm. The long-side length is changed optionally depending on the number of semiconductor elements mounted.

As shown in FIG. 3, the conductor patterns P1 to P3 are formed on one main surface of the circuit board 2, and a conductor pattern (not shown) is formed substantially throughout the other main surface at the opposite side. This conductor pattern is bonded to the main surface of the heatsink 3, and serves to transfer heat generated by the semiconductor element to the heatsink 3 for heat dissipation.

The heatsink 3 has a thickness of 0.8 to 4 mm, and formed of aluminum, an aluminum alloy, copper, or a copper alloy. The heatsink 3 has a long-side length longer than the long-side length of the circuit board 2, in order to ensure a heat capacity.

The long-side end edge portion of the heatsink 3 is clipped by the unit mounting part 50 having the rail structure formed on the main surface of the heatsink 4, and thereby the main surface of the heatsink 3 is positioned perpendicularly to the main surface of the heatsink 4.

The long-side end edge portion of the heatsink 3 is inserted into the slit of the unit mounting part 50, and then a caulking is performed by a press machine, so that the heatsink 3 is fixed. This configuration can reduce the size of the outer shape of the semiconductor device module 100 as small as possible, and also increase a heat capacity. This can improve the heat dissipation of the heat of the semiconductor element which is generated when the semiconductor device module 100 is driven.

The heatsink 4 has a thickness of 0.8 to 4 mm, and formed of aluminum, an aluminum alloy, a copper, or a copper alloy. The heatsink 4 has a long-side length longer than the long-side length of the circuit board 2, in order to ensure a heat capacity.

When welding the end of the main electrode terminal, a local welding which is a so-called microwelding is performed by utilizing arc discharge, as will be described later. Heat generated at that time can be dissipated through the heatsinks 3 and 4. Accordingly, heat equal to or higher than the melting temperature is not applied to the bonding material 11 used for bonding the respective parts, and a deterioration of the bonded part due to softening or melting of the bonding material 11 can be prevented.

A heat dissipating fin may be provided on the back surface side (the main surface side opposite to the side where the heatsink 3 is provided) of the heatsink 4. This can further improve the heat dissipation. Whether the heat dissipating fin is used or not may be determined in accordance with the amount of heat generation of the semiconductor element, and in accordance with the type of use of the semiconductor device module 100 or a mounting state of the semiconductor device module 100.

Instead of the heat dissipating fin, a cooling fan may be provided to perform force-air-cooling, or force cooling may be performed by water cooling. These methods are effective for ensuring an operation of the semiconductor device module 100 in a high-temperature operation range.

Although not shown in FIG. 3, the resin package 15 (FIG. 1) is formed on the main surface of the heatsink 3 at the side thereof where the circuit board 2 is bonded, such that the resin package 15 seals with a resin the circuit board 2 to which the IGBTs 1a, the SBDs 1b, the first main electrode terminal 5, the second main electrode terminal 6, and the wire member 10 are bonded. The back surface (the main surface opposite to the side where the circuit board 2 is bonded) side of the heatsink 3 is exposed.

A resin material of the resin package 15 is a resin including a silicon resin or an epoxy resin as a main component. The resin package 15 serves to, after the semiconductor elements and the wire member 10 are bonded, ensure insulation properties, fix and hold the first main electrode terminal 5 and the second main electrode terminal 6, and ensure the durability of the bonding to the circuit board 2. As a method of resin seating, for example, a potting method using a mold form is adopted, and shaping is performed by heating at 80 to 150° C.

Next, a configuration of the N-side package unit 22 will be described. FIG. 4 shows the N-side package unit 22 as seen from the resin package 15 side, with omission of the illustration of the resin package 15.

As compared with the P-side package unit 21 shown in FIG. 3, the N-side package unit 22 has a line-symmetrical structure with respect to an imaginary line set between both packages. The back surfaces of the heatsinks 3 in the respective packages are opposed to each other. This configuration is effective for improving the cooling capacity of the semiconductor device module 100 to realize a stable operation of the semiconductor element included in each package.

The parts of the configuration common to those of the P-side package unit 21 shown in FIG. 3 are denoted by the same reference numerals, and redundant descriptions are omitted. In the N-side package unit 22, the first main electrode terminal 7 is bonded to the end edge portion of the conductor pattern P1, and the wire member 10 and the second main electrode terminal 8 are bonded to the conductor pattern P2 at the side thereof opposite to the side where the first main electrode terminal 7 is bonded.

Each of the first main electrode terminal 7 and the second main electrode terminal 8 is formed of a metal having a good conductivity, such as copper or an alloy material thereof and has a thickness of 0.3 to 1.5 mm.

Through holes TH are formed in the first main electrode terminal 7, the second main electrode terminal 8, and the wire member 10, and filled with the bonding material 11. In this configuration, surfaces of the first main electrode terminal 7, the second main electrode terminal 8, and the wire member 10 are bonded to surfaces opposed thereto by the bonding material 11, and inner wall surfaces of the through holes TH are also bonded by the bonding material 11. Thus, bonded parts with a high reliability can be obtained. In the example of FIG. 4, the number of through holes TH provided in each of the first main electrode terminal 7 and the second main electrode terminal 8 is one. However, this is not limitative.

A separate conductor pattern P3 is provided in parallel with the extending direction of the conductor pattern P1. The signal terminal 13 is bonded to the conductor pattern P3, and the conductor pattern P3 and the gates of the IGBTs 1*a* are bonded to each other by leads 14.

Figure 4:
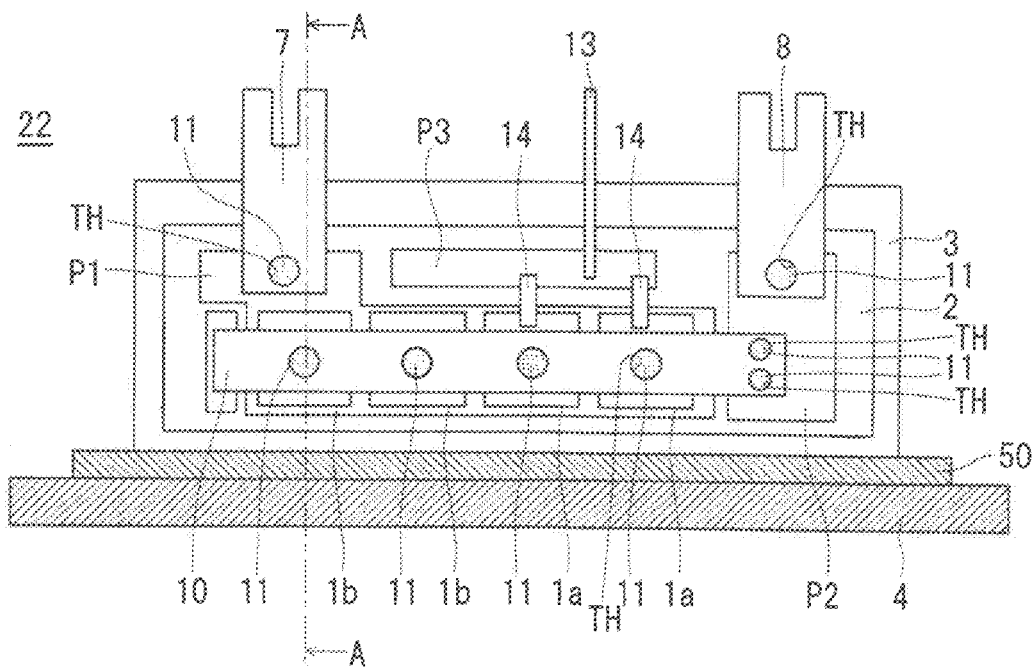
FIG. 4 shows a configuration of an N-side package unit.

Although not shown in FIG. 4, the resin package 15 (FIG. 1) is formed on the main surface of the heatsink 3 at the side thereof where the circuit board 2 is bonded, such that the resin package 15 seals with a resin the circuit board 2 to which the IGBTs 1*a*, the SBDs 1*b*, the first main electrode terminal 7, the second main electrode terminal 8, and the wire member 10 are bonded. The back surface (the main surface opposite to the side where the circuit board 2 is bonded) side of the heatsink 3 is exposed.

Figure 5:
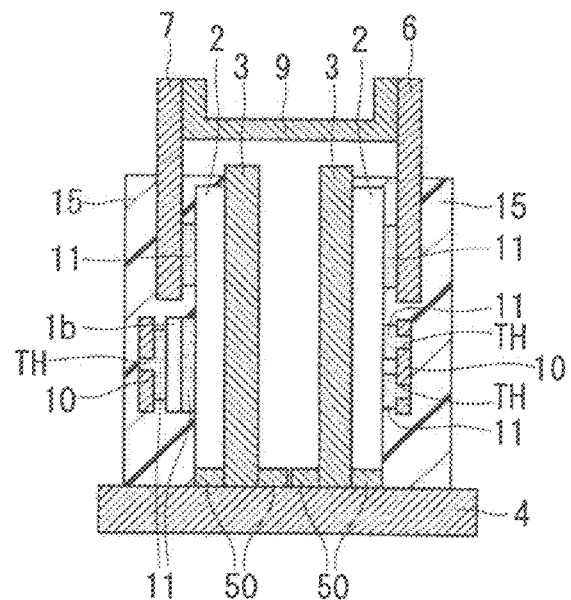
FIG. 5 is a cross-sectional view showing a configuration of the semiconductor device module before welding.

FIG. 5 shows a cross section as taken along the line A-A of FIGS. 3 and 4. As shown in FIG. 5, the conductive connecting member 9 is interposed between the second main electrode terminal 6 of the P-side package unit 21 and the first main electrode terminal 7 of the N-side package unit 22.

In this manner, the circuit board 2, the IGBTs 1*a*, the SBDs 1*b*, and the wire member 10 are sealed with a resin within the resin package 15. However, the long-side length of each of the first main electrode terminals 5 and 7 and each of the second main electrode terminals 6 and 8 protrudes out of the resin package 15 by 2 to 15 mm. A protruding end of each main electrode terminal is not flat, but is concavo-convex because a central portion of a short side is recessed as shown in FIGS. 3 and 4.

Such a shape can prevent an occurrence of contact between welded parts when the second main electrode terminal 6 and the first main electrode terminal 7 are welded to the connecting member 9.

If the direction along the short side of each main electrode terminal is called a width direction, the sizes of a recess and a protrusion of the concavo-convex shape are set so as to satisfy the relationship of $X \geq 0.4 A$, where the width of the main electrode terminal is defined as A (mm) and the width of the recess is defined as X (mm).

The size of the concavo-convex shape is set in this manner in order to prevent the possibility that adjacent welded parts are brought into contact or bonded to each other, which may occur if the width of the recess is narrow when the second main electrode terminal 6 and the first main electrode terminal 7 are welded to the connecting member 9.

If the welded parts are bonded to each other, the welded part does not have a substantially hemispherical shape which is a stable shape, but has an unstable shape, which may deteriorate a reliability. On the other hand, downsizing and weight reduction of the semiconductor device module 100 has been demanded, and therefore the width of the main electrode terminal cannot be increased without limit. Considering improvement of the reliability of the bonded part and ensure of the quality of the product, it is desirable to satisfy the above-described relationship.

If the width of the recess is excessively increased, the width of the protrusion is narrowed. This hinders a welding work and reduces the bonding strength. Therefore, it is desirable that the upper limit of the width of the recess is approximately 0.5 times the width of the protrusion.

Figure 6:
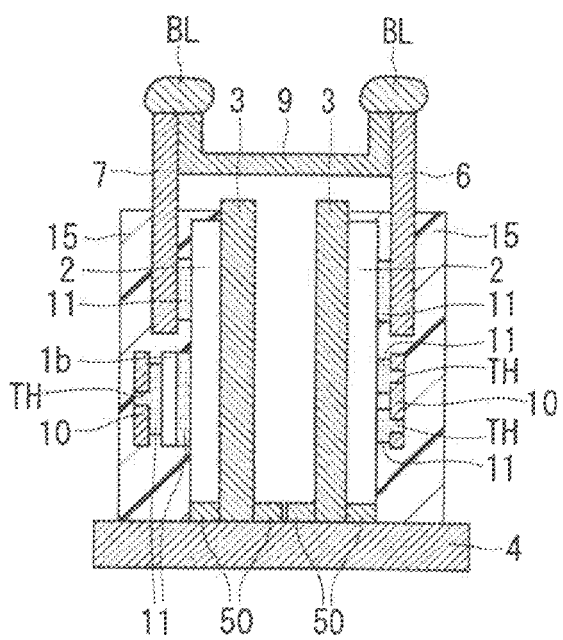
FIG. 6 is a cross-sectional view showing a configuration of the semiconductor device module after welding.

FIG. 6 shows a cross-sectional view in a state where the second main electrode terminal 6 and the first main electrode terminal 7 are bonded to the connecting member 9 by a local welding utilizing arc discharge. The P-side package unit 21 and the N-side package unit 22, which are obtained after the resin packages 15 are formed, are mounted on the unit mounting parts 50 provided on the heatsink 4, and caulking is performed by a press machine or the like. Then, the connecting member 9 is interposed between the second main electrode terminal 6 and the first main electrode terminal 7. Thus, the state shown in FIG. 5 is obtained.

The connecting member 9 has such a shape that both end portions thereof with respect to a direction along its long side are bent in the same direction by approximately 90 degrees. An end of the bent portion has a concave-convex shape similarly to the main electrode terminal. If a direction along a short side of the connecting member 9 is called a width direction, the width of the connecting member 9 is set at the same value as the width of the second main electrode terminal 6 and the first main electrode terminal 7, and the sizes of the recess and the protrusion are the same as those of the second main electrode terminal 6 and the first main electrode terminal 7. This configuration enables assembling and welding to be performed easily.

The connecting member 9 is interposed between the second main electrode terminal 6 and the first main electrode terminal 7 such that end portions of the second main electrode terminal 6 and the first main electrode terminal 7 coincide with the end of the bent portions of the connecting member 9.

Then, by a local welding utilizing arc discharge, the end portions of the second main electrode terminal 6 and the first main electrode terminal 7 are welded to the end portions of the connecting member 9. The end portions are melted by heat caused by the arc discharge, to form welded parts BL having a substantially hemispherical shape.

Here, the maximum width of the welded part BL is equal to or greater than 1.1 times the width of the protrusion formed at the end portion of each of the second main electrode terminal 6 and the first main electrode terminal 7 before bonding. This can enhance the reliability of the bonded part, to increase the quality of the product.

The reason therefor will be described with reference to FIG. 7. FIG. 7 shows a result of a bonding strength test, when the horizontal axis represents a ratio of a bonding width (the maximum width of the welded part BL) to the width of the protrusion of the main electrode terminal, and the vertical axis represents a break strength (N).

FIG. 7 reveals that when the maximum width of the welded part BL is equal to or greater than 1.1 times the width of the protrusion of the main electrode terminal, the break strength exceeds 10 N (newton), and a necessary bonding strength is provided. Around the point at which the ratio represented by the horizontal axis exceeds 1, the break strength rapidly increases, but when the ratio is lower than 1.1, it is difficult to obtain a sufficient bonding strength.

The 1.1 times ensures the reliability of the bonded part of the electrode with the minimum energy, and such a structure is called a minimum bonding structure. By adopting the minimum bonding structure, a production cost can be reduced, and additionally downsizing and weight reduction can be realized.

The necessary bonding strength can be obtained when the maximum width of the welded part BL is equal to or greater than 1.1 times the width of the protrusion of the main electrode terminal. However, from FIG. 7, it can be considered that the upper limit thereof is approximately twice the width of the protrusion of the main electrode terminal, based on the relationship with the width of the recess of the main electrode terminal.

As the welding method, an electron beam welding or a laser welding may be used instead of the local welding utilizing the arc discharge. In such a case as well, a welded part BL having a substantially hemispherical shape can be formed.

The local welding utilizing the arc discharge is performed after the P-side package unit 21 and the N-side package unit 22 obtained after the resin packages 15 are formed are mounted on the unit mounting parts 50 and caulked. Therefore, the semiconductor element is covered with the sealing resin, and the semiconductor element is not damaged by the arc discharge which spreads in a skirt-like manner. The same effect is obtained also when the electron beam welding or the laser welding is used.

Since the second main electrode terminal 6 and the first main electrode terminal 7 are connected to each other by the connecting member 9, the P-side package unit 21 and the N-side package unit 22 are electrically connected, to form the inverter circuit as one set shown in FIG. 2.

<Manufacturing Method>

Next, a method of manufacturing the semiconductor device module 100 will be described with reference to FIGS. 8 to 16 showing manufacturing steps in order. In the following, a method of manufacturing the P-side package unit 21 shown in FIG. 3 will be described as an example.

Firstly, in a step shown in FIG. 8, the circuit board 2 having the conductor patterns P1 to P3 formed one main surface thereof is prepared. The bonding material 11 are arranged at regions on the conductor pattern P1 in which the semiconductor elements will be mounted.

Figure 9:
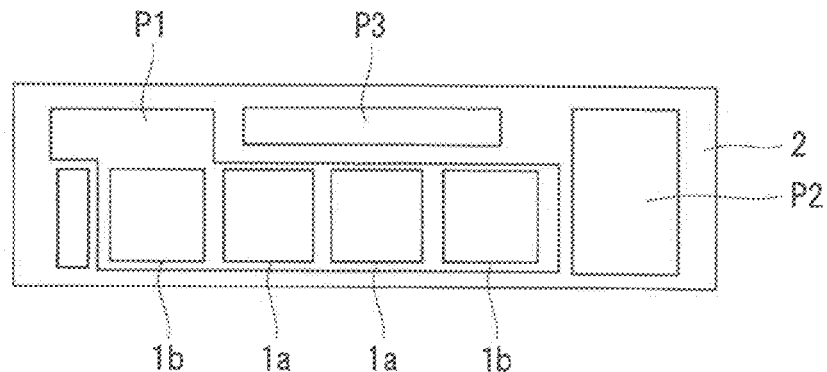

Then, in a step shown in FIG. 9, the IGBTs 1a and the SBDs 1b are prepared, and mounted in the region where the bonding material 11 is arranged.

Figure 10:
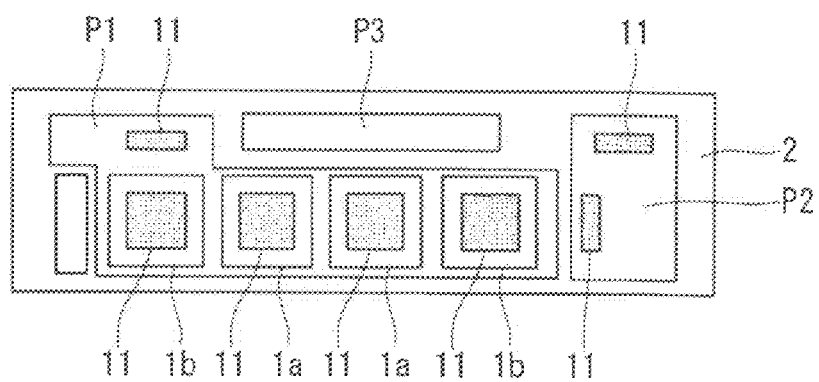

Then, in a step shown in FIG. 10, the bonding material 11 is arranged on the upper surfaces of the IGBTs 1a and the SBDs 1b, in regions on the conductor patterns P1 and P2 to which the first main electrode terminal 5 and the second main electrode terminal 6 will be bonded, respectively, and in a region on the conductor pattern P2 to which the wire member 10 will be bonded.

Figure 11:
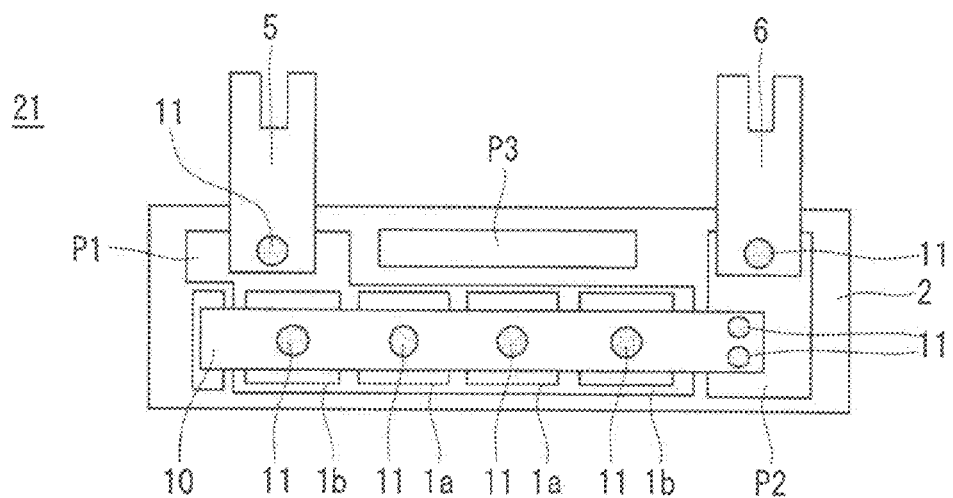

Then, in a step shown in FIG. 11, the wire member 10, the first main electrode terminal 5, and the second main electrode terminal 6 are prepared, and mounted in the regions where the bonding material 11 is arranged. Then, the circuit board 2 is heated under a predetermined temperature condition, to solidify (or cure) the bonding material 11, thereby bonding (fixedly attaching) each component onto the circuit board 2.

Then, in a step shown in FIG. 12, the heatsink 3 is prepared, and the bonding material 11 is arranged in a region on one main surface thereof to which the circuit board 2 will be bonded.

Then, in a step shown in FIG. 13, the circuit board 2 having the semiconductor elements mounted thereon is mounted in the region where the bonding material 11 is arranged, and heated under a predetermined temperature condition, to solidify (or cure) the bonding material 11, thereby bonding (fixedly attaching) the circuit board 2 onto the heatsink 3.

Figure 14:
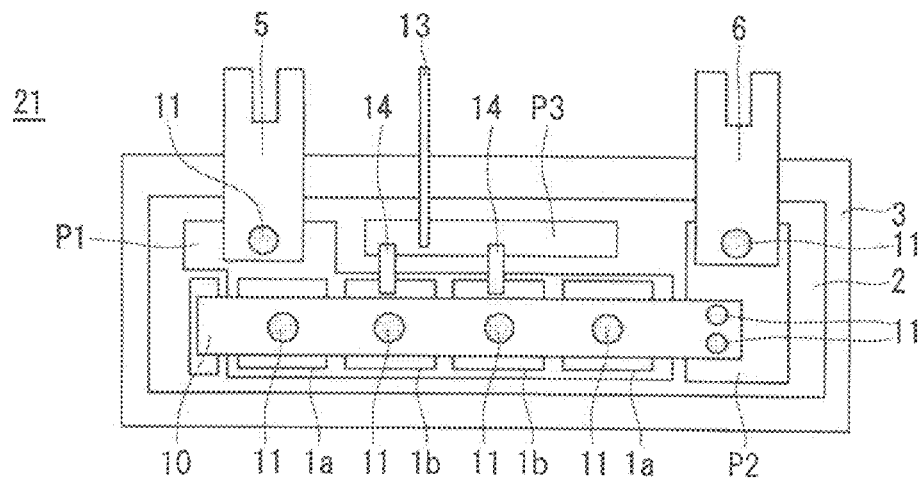

Then, in a step shown in FIG. 14, in order to electrically connect the gates of the IGBTs 1a to the conductor pattern P3, the leads 14 are bonded by a wire bonding or a ultrasonic bonding. The signal terminal 13 is also connected to the conductor pattern P3 by a wire bonding or a ultrasonic bonding. For descriptive purposes, the configuration obtained after this and previous steps are completed is referred to as a circuit unit.

Figure 15:
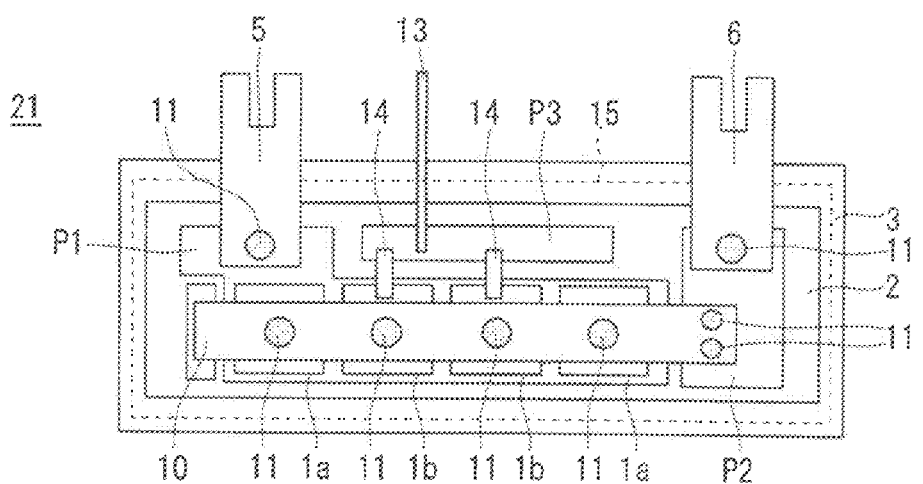

Next, in a step shown in FIG. 15, the circuit board 2 having the semiconductor elements mounted thereon is sealed with a resin on the heatsink 3. As a specific sealing method, the heatsink 3 is fitted in a mold form which completely covers the circuit board 2 and from which the end portions of the first main electrode terminal 5 and the second main electrode terminal 6 protrude, and a thermosetting sealing resin is introduced into the mold form and heated at 80 to 150° C. to cure the resin, so that the resin package 15 is formed. Thus, the P-side package unit 21 and the N-side package unit 22 are completed.

Figure 16:
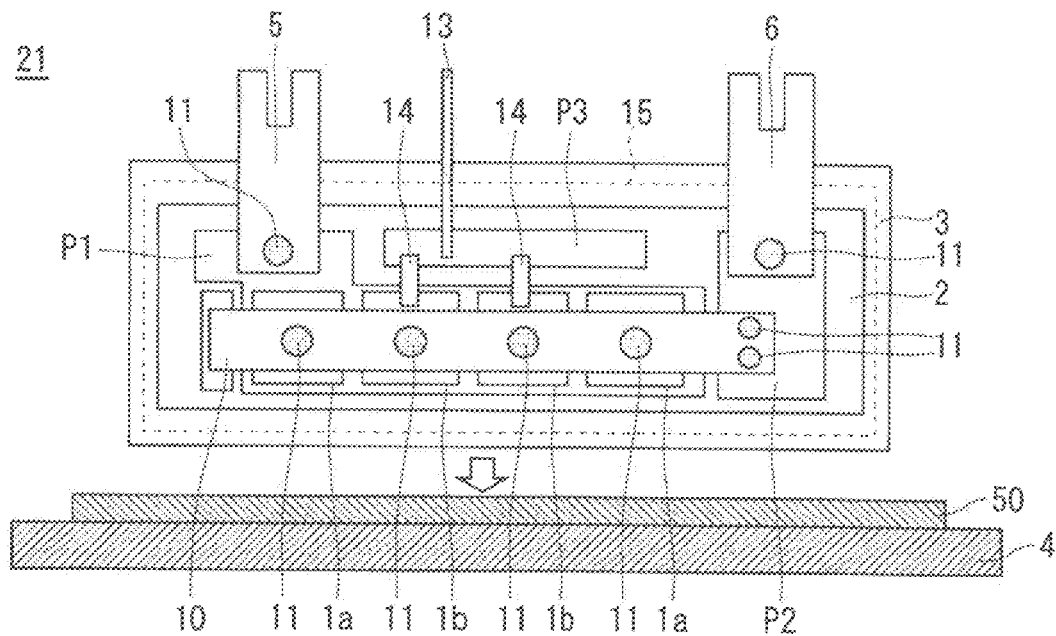

Then, in a step shown in FIG. 16, the heatsink 4 is prepared, and the long side (the long side at which no main electrode terminal is provided) of the heatsink 3 included in each of the P-side package unit 21 and the N-side package unit 22 is inserted into the slit of the rail of the unit mounting part 50, and an elongated member forming the rail is caulked by using a press machine, thereby fixing. Thus, the main surface of the heatsink 3 is fixedly positioned perpendicularly to the main surface of the heatsink 4.

Then, the connecting member 9 is interposed between the second main electrode terminal 6 and the first main electrode terminal 7, the end portions of the second main electrode terminal 6 and the first main electrode terminal 7 are welded to the end portions of the connecting member 9 by the local welding utilizing the arc discharge. Thereby, the welded parts BL shown in FIG. 6 are formed, and thus the semiconductor device module 100 is completed.

<Effects>

As described above, in the semiconductor device module 100, when the second main electrode terminal 6 and the first main electrode terminal 7 are bonded to the connecting member 9, a bonding material (for example, a solder material) formed of a metal different from the bonded material (the main electrode terminal) is not used, but the second main electrode terminal 6, the first main electrode terminal 7, and the connecting member 9, which are base members, are melted and solidified so that metal atoms are combined. Therefore, no mismatch occurs between the linear coefficient of expansion of the base members and the linear coefficient of expansion of the bonding material.

A semiconductor device module is required to be used under a very hostile environment in which a temperature variation is large such as a temperature difference ($\Delta T$) of 225° C. or higher. Accordingly, if the bonding is performed via a material having a different linear coefficient of expansion, such as a solder material, a thermal distortion or a thermal stress occurs in the bonded part due to a mismatch with the linear coefficient of expansion of the base member, which may cause cracking. Since the main electrode terminal has a small thickness of 0.3 to 1.5 mm, once cracking occurs, the cracking may advance.

However, in the present invention, since the local welding utilizing the arc discharge is used, the welding is completed in several msec to several sec. Thus, occurrence of a thermal distortion can be suppressed, and additionally no mismatch of the linear coefficient of expansion occurs so that occurrence of cracking due to a difference in the linear coefficient of expansion can be suppressed. Therefore, a bonded part with a high reliability can be obtained.

Since the solder material having a heat resistance of 175° C. or higher or the silver-nanoparticle paste is used as the bonding material 11, a heat resistance of 175° C. or higher can be ensured also for the bonded part within the resin package 15. This, together with the use of the silicon carbide semiconductor element as the semiconductor element, can increase the reliability of the semiconductor device module 100 itself and the quality of the product.

The long-side end edge portion of the heatsink 3 is clipped by the unit mounting part 50 having a rail structure and formed on the main surface of the heatsink 4, so that the heatsink 4 is fixed. This can ensure and strengthen the fixation of the heatsink 4.

The main surface of the heatsink 3 is positioned perpendicularly to the main surface of the heatsink 4. This configuration, together with the configuration in which the main electrode terminals protrude from the side surface of the resin package 15, can realize downsizing and weight reduction.

The heat capacity can be increased by the combination of the heatsinks 3 and 4. Additionally, the back surface of the heatsink 3 is exposed to the air, and therefore heat dissipation can be performed at the back surface of the heatsink 3, too. This can improve heat dissipation for the semiconductor element which generates heat when the semiconductor device module 100 is driven, so that a normal operation is allowed at a higher temperature.

Preferred Embodiment 2

Next, a configuration of a semiconductor device module 200 according to a preferred embodiment 2 of the present invention will be described with reference to FIG. 17. The same parts of the configuration of the semiconductor device module 100 shown in FIGS. 3 and 4 will be denoted by the same reference numerals, and redundant descriptions are omitted.

Figure 17:
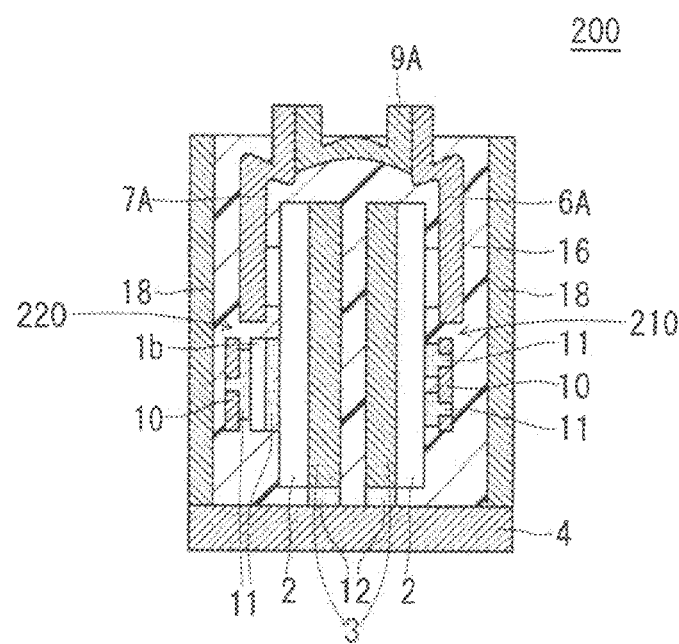
FIG. 17 is a cross-sectional view showing a configuration of a semiconductor device module according to a preferred embodiment 2 of the present invention.

FIG. 17 is a cross-sectional view at the same portion as that of the semiconductor device module 100 shown in FIGS. 3 and 4. The semiconductor element 1b is bonded onto the circuit board 2, and the heatsink 3 is bonded onto the main surface of the heatsink 4 by using a bonding material 12.

A P-side circuit and an N-side circuit are surrounded by a casing 18. A sealing material 16 having insulation properties is loaded within a housing made up of the casing 18 and the heatsink 4, thus sealing the P-side circuit and the N-side circuit with a resin. The casing 18 is formed of an insulating material such as PPS, PBT, SPS, and epoxy, and has a thickness of 0.5 to 1.5 mm.

In this manner, in the semiconductor device module 200, the P-side circuit and the N-side circuit are commonly sealed with a resin, and a single resin package is used. Thus, for descriptive purposes, the P-side circuit and the N-side circuit will be referred to as a P-side circuit unit 210 and a N-side circuit unit 220, respectively.

Each of a second main electrode terminal 6A of the P-side circuit unit 210 and a first main electrode terminal 7A of the N-side circuit unit 220 has its upper end portion bent twice to form a z-like shape in a cross section. That is, the upper end portion is firstly bent in the direction perpendicular to the main surface of the main electrode terminal, to form a first bent portion, and the upper end portion is then bent back in the direction parallel to the main surface of the main electrode terminal, to form a second bent portion. Each of the first and second bent portions is bent at an angle slightly smaller than the right angle. Thus, the z-like cross sectional shape is formed. The same applies to the first main electrode terminal 7A, also to a first main electrode terminal (not shown) of the P-side circuit unit 210 and a second main electrode terminal (not shown) of the N-side circuit unit 220.

A connecting member 9A between the second main electrode terminal 6A and the first main electrode terminal 7A has such a shape that both end portions thereof with respect to a direction along its long side are bent in the same direction at an angle slightly smaller than 90 degrees and a central portion thereof is curved in a cross section.

This configuration enables a thermal stress and a thermal distortion occurring in the bonded part of each main electrode terminal to be absorbed by the bent portions, so that the reliability and the quality of the product can further be increased.

That is, it is effective particularly when the semiconductor device module 200 is used under a hostile environment, for example, used in cold climates, in a vehicle, and the like.

Since each main electrode terminal has a bent shape, the length of the electrode can be shortened, which can realize further downsizing and weight reduction.

That is, the density of copper or a copper alloy which is the material of the main electrode terminal is about 8933 kg/m$^3$, and a weight ratio of the material of the main electrode terminal in the total weight of the semiconductor device module is highest next to a weight ratio of the heatsink. A bending process for the respective main electrode terminals is performed with a high production efficiency by a progressive die using a press machine or the like.

In the semiconductor device module 200, the heatsink 3 is bonded onto the main surface of the heatsink 4 by using the bonding material 12. As the bonding material 12, used is a brazing material such as a high-temperature solder containing Sn as a main component and having a heat resistance of 175° C. or higher, or a conductive adhesive such as a silver-nanoparticle paste. This can ensure the durability even if the semiconductor device module 200 is used under a high temperature of 175° C. or higher. Moreover, since the bonding material 12 has a thermal conductivity of 20 to 90 W/mK, heat generated by the semiconductor element during the operation can be efficiently transferred to the heatsink 4 via the heatsink 3.

In the semiconductor device module 200, similarly to the semiconductor device module 100 shown in FIG. 3, the heatsink 3 may be fixed by using the unit mounting part 50 and performing a caulking. On the contrary, in the semiconductor device module 100, similarly to the semiconductor device module 200, the heatsink 3 may be bonded by using the bonding material 12.

To manufacture the semiconductor device module 200, a side surface of the long side (the long side at which no main electrode terminal is provided) of the heatsink 3 included in each of the P-side circuit unit 210 and the N-side circuit unit 220 is bonded to one main surface of the heatsink 4 by using the bonding material 12, and then the casing 18 having no bottom and no lid is fixed onto the main surface of the heatsink 4 so as to surround the P-side circuit unit 210 and the N-side circuit unit 220 by using an adhesive (not shown).

Then, for example, a silicone gel or an epoxy resin is, as the sealing material 16, loaded in the housing made up of the casing 18 and the heatsink 4.

By providing the housing in which the sealing material 16 is loaded in this manner, the manufacturing steps can be simplified. Also, the P-side circuit unit 210 and the N-side circuit unit 220, except the end portions of the main electrode terminals, are covered by the sealing material 16. This can prevent any defect from occurring in parts other than the bonded parts during the welding.

Then, the connecting member 9 is interposed between the second main electrode terminal 6 and the first main electrode terminal 7 which protrude from the sealing material 16, and the end portions of the second main electrode terminal 6 and the first main electrode terminal 7 are welded to the end portions of the connecting member 9 by the local welding utilizing the arc discharge. Thus, the semiconductor device module 200 is completed.

In the semiconductor device module 100 of the preferred embodiment 1, the second main electrode terminal 6A, the first main electrode terminal 7A, and the connecting member 9A may be used instead of the second main electrode terminal 6, the first main electrode terminal 7, and the connecting member 9, respectively.

Preferred Embodiment 3

Next, a configuration of a semiconductor device module 300 according to a preferred embodiment 3 of the present invention will be described with reference to FIGS. 18 and 19. The same parts of the configuration as those of the semiconductor device module 100 shown in FIGS. 3 and 4 are denoted by the same reference numerals, and redundant descriptions are omitted.

Figure 18:
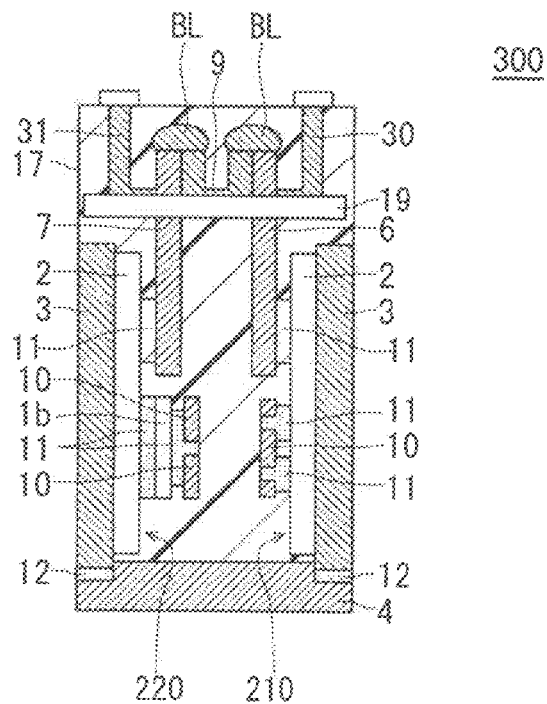
FIG. 18 is a cross-sectional view showing a configuration of a semiconductor device module according to a preferred embodiment 3 of the present invention.

FIG. 18 is a cross-sectional view at the same portion as that of the semiconductor device module 100 shown in FIGS. 3 and 4. The semiconductor element 1b is bonded onto the circuit board 2, and the heatsink 3 is bonded onto the main surface of the heatsink 4 by using the bonding material 12.

A control board 19 is positioned above the P-side circuit and the N-side circuit. The control board 19 includes a control circuit that generates a control signal to be supplied to the gate of the IGBT 1a (not shown). The P-side circuit and the N-side circuit, together with the control board 19, are entirely accommodated in a resin package 17.

In this manner, in the semiconductor device module 300, the P-side circuit and the N-side circuit are commonly sealed with a resin, and a single resin package is used. Thus, for descriptive purposes, the P-side circuit and the N-side circuit will be referred to as a P-side circuit unit 210 and a N-side circuit unit 220, respectively.

Figure 19:
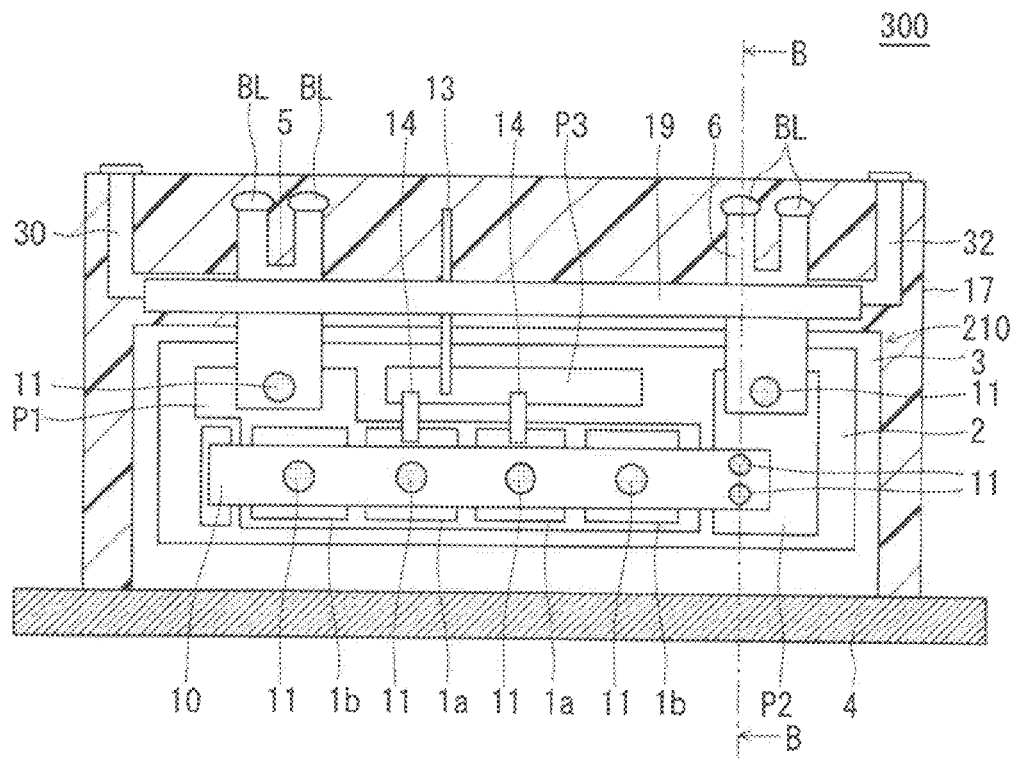
FIG. 19 is a diagram showing a configuration of a P-side circuit unit according to the preferred embodiment 3 of the present invention.

As shown in FIG. 19, the P-side circuit unit 210 and the N-side circuit unit 220 are mounted on the heatsink 4 such that their circuit boards 2 are opposed to each other. Back surfaces of the heatsinks 3 thereof are exposed at side surfaces of the resin package 17.

A side surface of the long side (the long side at which no main electrode terminal is provided) of the heatsink 3 of each of the P-side circuit unit 210 and the N-side circuit unit 220 is bonded by the bonding material 12 to a stepped portion provided along a long-side end edge portion of the heatsink 4. As the bonding material 12, used is a brazing material such as a high-temperature solder containing Sn as a main component and having a heat resistance of 175° C. or higher, or a conductive adhesive such as a silver-nanoparticle paste.

The second main electrode terminal 6 of the P-side circuit unit 210 and the first main electrode terminal 7 of the N-side circuit unit 220 extend through the control board 19 positioned above them. The end portions of the second main electrode terminal 6 and the first main electrode terminal 7 are welded to the end portions of the connecting member 9 interposed between the second main electrode terminal 6 and the first main electrode terminal 7 by the local welding utilizing the arc discharge. Thus, the welded parts BL are formed.

The first main electrode terminal 5 (not shown) of the P-side circuit unit 210 and the second main electrode terminal 8 (not shown) of the N-side circuit unit 220 extend through the control board 19 positioned above them, and their respective end portions are welded to external terminals 30 and 31 by the local welding utilizing the arc discharge. The end portions of the external terminals 30 and 31 protrude from an upper surface of the resin package 17, and are connected to a power source, an electrical equipment, and the like.

FIG. 19 shows the P-side circuit unit 210 as seen from the circuit board 2 side, with omission of the illustration of the resin package 17 positioned on the P-side circuit unit 210. FIG. 18 is a cross-sectional view taken along the line B-B of FIG. 19.

As shown in FIG. 19, the signal terminal 13 connected to the conductor pattern P3 extends toward the control board 19 positioned above it and is connected to a control circuit (not shown) of the control board 19, so that a control signal is supplied to the signal terminal 13.

The second main electrode terminal 6 of the P-side circuit unit 210 and the first main electrode terminal 7 (not shown) of the N-side circuit unit 220 are connected to the connecting member 9 (not shown). The connecting member 9 is further connected to an external terminal 32, and an end portion of the external terminal 32 protrudes from the upper surface of the resin package 17. The external terminal 32 may be formed integrally with the connecting member 9.

In this manner, in the semiconductor device module 300, the back surfaces of the heatsinks 3 of the P-side circuit unit 210 and the N-side circuit unit 220 are exposed at the side surfaces of the resin package 17, and the back surface of the heatsink 4 is also exposed. Thus, three surfaces (heat dissipation surfaces) involved in heat dissipation are exposed to the outside, which can provide higher heat dissipation. Therefore, the characteristics of the semiconductor element can be sufficiently exerted.

The exposed heat dissipation surfaces may be naturally cooled. Alternatively, an air-cooling fin may be attached to each heat dissipation surface, and a water-cooling fin may be attached.

To manufacture the semiconductor device module 300, the side surface of the long side (the long side at which no main electrode terminal is provided) of the heatsink 3 of each of the P-side circuit unit 210 and the N-side circuit unit 220 is bonded by using the bonding material 12 to the main surface of the heatsink 4 in which the stepped portions are formed along the long-side end edge portions thereof, and then the control board 19 is arranged such that each main electrode terminal extends through an opening portion of the control board 19 and the signal terminal 13 of each of the P-side circuit unit 210 and the N-side circuit unit 220 is connected to a predetermined control circuit on the control board 19. At this time, the signal terminal 13 may be connected to the control circuit by a soldering for example, so that the signal terminal 13 supports the control board 19.

Then, the connecting member 9 is interposed between the second main electrode terminal 6 and the first main electrode terminal 7, and the end portions of the second main electrode terminal 6 and the first main electrode terminal 7 are welded to the end portion of the connecting member 9 by the local welding utilizing the arc discharge. At this time, if the connecting member 9 formed integrally with the external terminal 32 is used, the step of welding the external terminal 32 to the connecting member 9 can be saved.

The external terminals 30 and 31 are welded to the first main electrode terminal 5 of the P-side circuit unit 210 and the second main electrode terminal 8 (not shown) of the N-side circuit unit 220, respectively, by the local welding utilizing the arc discharge. End portions of the external terminals 30 and 31 which are connected to the first main electrode terminal 5 and the second main electrode terminal 8, respectively, may have concavo-convex shapes, similarly to the end portions of the first main electrode terminal 5 and the second main electrode terminal 8.

Then, the resin package 17 is formed such that the parts of the external terminals 30 to 32 other than the end portions thereof are completely sealed with a resin.

As a specific sealing method, a mold form is positioned on the heatsink 4 so as to surround the P-side circuit unit 210, the N-side circuit unit 220, and the external terminal 30 to 32 except the end portions thereof, and a thermosetting sealing resin is introduced into the mold form and heated at 80 to 150° C. to cure the resin, so that the resin package 17 is formed.

In this configuration, since the parts where the respective main electrode terminals are bonded to the circuit boards 2 are also covered by the resin package 17, the reliability and the quality of the product can be increased.

Moreover, since the resin-sealing is performed as an integral forming using a die, the manufacturing can be made at a low cost and very high-productivity.

The second main electrode terminal 6A, the first main electrode terminal 7A, and the connecting member 9A, which are used in the semiconductor device module 200 of the preferred embodiment 2, may be used in the semiconductor device module 300 of the preferred embodiment 3 instead of the second main electrode terminal 6, the first main electrode terminal 7, and the connecting member 9, respectively.

Modification 1

Figure 20:
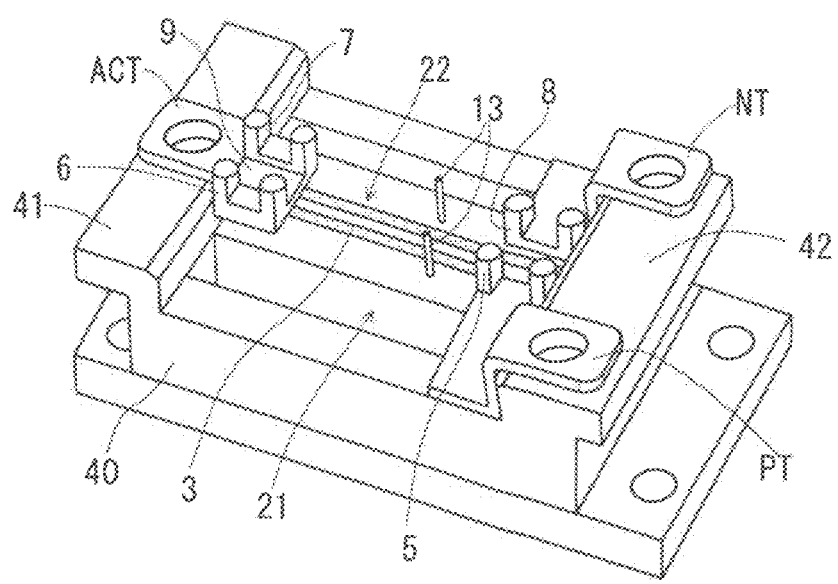
FIG. 20 is a perspective view showing a configuration of a semiconductor device module according to a modification of the present invention.

FIG. 20 shows a configuration in which the circumference of the semiconductor device module 100 shown in FIG. 1 is surrounded by a resin casing 40. The same parts of the configuration as those of the semiconductor device module 100 shown in FIG. 1 are denoted by the same reference numerals, and redundant descriptions are omitted.

As shown in FIG. 20, the resin casing 40 having no bottom and no lid is fixed onto the main surface of the heatsink 4 so as to surround the P-side package unit 21 and the N-side package unit 22.

The resin casing 40 has seat portions 41 and 42 at both ends thereof with respect to the long-side direction thereof. Each of the seat portions 41 and 42 is formed so as to extend outwardly.

On the seat portion 41, an external terminal ACT extends from the connecting member 9. On the seat portion 41, an external terminal PT welded to the first main electrode terminal 5 of the P-side package unit 21 and an external terminal NT welded to the second main electrode terminal 8 of the N-side package unit 22 extend.

The connecting member 9 and the external terminal ACT are formed integral with each other. By welding the connecting member 9 to the second main electrode terminal 6 and the first main electrode terminal 7, the second main electrode terminal 6 and the first main electrode terminal 7 are electrically connected to the external terminal ACT.

The local welding utilizing the arc discharge is also adopted for welding the first main electrode terminal 5 of the P-side package unit 21 to the external terminal PT, and welding the second main electrode terminal 8 of the N-side package unit 22 to the external terminal NT.

End portions of the external terminals PT and NT, which are connected to the first main electrode terminal 5 and the second main electrode terminal 8, respectively, may have concavo-convex shapes similarly to the end portions of the first main electrode terminal 5 and the second main electrode terminal 8.

In this manner, arranging the resin casing 40 so as to surround the P-side package unit 21 and the N-side package unit 22 makes the structure of the semiconductor device module 100 stronger as one unit.

There is also an advantageous effect that connection to a power source, an electrical equipment, and the like, is made easy by providing the external terminals ACT, PT, and NT.

Modification 2

In the above-described semiconductor device modules 100 to 300, two circuit units forming the inverter IV1 in the three-phase inverter IV shown in FIG. 2 are provided. Forming one module by a plurality of circuit units in this manner can improve assemblability.

However, the module may be formed only by the circuit unit having the transistor and the free-wheeling diode at one potential side in one inverter. In such a case, the three-phase inverter IV is configured by the combination of six semiconductor device modules.

The module may also be configured so as to includes not one inverter but three inverters, that is, include all the circuit units forming the three-phase inverter IV shown in FIG. 2. In such a case, the three-phase inverter IV shown in FIG. 2 is configured as a single semiconductor device module. All the circuit units forming the three-phase inverter are arranged on a single heatsink 4 is more advantageous from the viewpoint of assemblability.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device module comprising:
a plurality of circuit units, each circuit unit of the plurality of circuit units having
a circuit board having a semiconductor element mounted thereon,
a main electrode terminal which is electrically connected to a main electrode of said semiconductor element, and
a first heatsink having said circuit board mounted thereon;
a second heatsink having said plurality of circuit units mounted thereon; and
a connecting member that connects said main electrode terminals of said plurality of circuit units to each other,
wherein
said first heatsink is mounted on said second heatsink such that a main surface thereof extends perpendicularly to a main surface of said second heatsink,
said main electrode terminal extends in a direction parallel to said main surface of said first heatsink, and has one end thereof connected to said circuit board and an other end thereof protruding from an upper side of said first heatsink,
said main electrode terminal is configured as a plate-like member, and said other end has a concavo-convex shape in which a central portion thereof is recessed and both sides thereof protrude,
said plurality of circuit units are mounted on said second heatsink such that said first heatsinks thereof are in parallel with each other, and
said connecting member and said main electrode terminal are bonded to each other by a welded part.

2. The semiconductor device module according to claim 1, wherein
said connecting member is configured as a plate-like member, and has an end portion with a same shape and a same size as those of said concavo-convex shape of said main electrode terminal, said connecting member being provided such that a protrusion of said connecting member is opposed to the protrusion of said main electrode terminal.

3. The semiconductor device module according to claim 1, wherein
a hemispherical welded part is formed at a bonded part between said connecting member and said main electrode terminal, and a maximum width of said hemispherical welded part is equal to or greater than 1.1 times a width of the protrusion of said main electrode terminal.

4. The semiconductor device module according to claim 1, wherein
a width of the recess of the central portion of the other end of said main electrode terminal is equal to or greater than 0.4 times a terminal width.

5. The semiconductor device module according to claim 1, wherein
said circuit board has a conductor pattern on a main surface,
said one end of said main electrode terminal is connected to said conductor pattern, and
said plurality of circuit units each comprise a wire member that electrically connects said main electrode of said semiconductor element to said conductor pattern.

6. The semiconductor device module according to claim 1, wherein
said plurality of circuit units each has a resin package arranged on said first heatsink and formed so as to completely cover said circuit board, and
said other end of said main electrode terminal protrudes from a side surface of said resin package.

7. The semiconductor device module according to claim 1, comprising a casing mounted on said second heatsink and surrounding a circumference of said plurality of circuit units except said other end of said main electrode terminal, a sealing material having insulation properties is loaded within a housing configured by said casing and said second heatsink.

8. The semiconductor device module according to claim 1, wherein an end surface of said first heatsink opposite to the side at which said main electrode terminal protrudes is bonded to an end edge portion of said second heatsink by a bonding material such that a back surface of said first heatsink opposite to the side where said circuit board is mounted faces outside, said plurality of circuit units include a resin package that seals with a resin a whole of said plurality of circuit units except said back surface of said first heatsinks.

9. The semiconductor device module according to claim 1, wherein
said main electrode terminal is configured as a plate-like member, and said other end thereof is bent in a direction perpendicular to its main surface, to form a first bent portion, and then bent back in a direction parallel to the main surface, to form a second bent portion, so that said main electrode terminal has a z-like cross-sectional shape.

10. The semiconductor device module according to claim 1, wherein
said first heatsink is fixed by an end edge portion opposite to the side at which said main electrode terminal protrudes being clipped by a rail-shaped unit mounting part provided on said second heatsink.

11. The semiconductor device module according to claim 1, wherein
an end surface of said first heatsink opposite to the side at which said main electrode terminal protrudes is bonded onto said second heatsink by a bonding material.

12. The semiconductor device module according to claim 1, wherein
said semiconductor element is a silicon carbide semiconductor element.